(12) United States Patent
Tsang et al.

(10) Patent No.: US 12,238,893 B2
(45) Date of Patent: Feb. 25, 2025

(54) FLOW GUIDING DEVICE AND LIQUID-COOLED CHASSIS WITH SAME

(71) Applicant: Fulian Precision Electronics (Tianjin) Co., LTD., Tianjin (CN)

(72) Inventors: Sung Tsang, New Taipei (TW); Tsung-Lin Liu, Neihu (TW); Yu-Chia Ting, Neihu (TW); Cheng-Yi Huang, New Taipei (TW); Chia-Nan Pai, New Taipei (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 187 days.

(21) Appl. No.: 18/092,063

(22) Filed: Dec. 30, 2022

(65) Prior Publication Data

US 2024/0147664 A1 May 2, 2024

(30) Foreign Application Priority Data

Nov. 2, 2022 (CN) .......................... 202222986185.0

(51) Int. Cl.
*H05K 7/20* (2006.01)
(52) U.S. Cl.
CPC ......... *H05K 7/20327* (2013.01); *H05K 7/203* (2013.01); *H05K 7/20318* (2013.01); *H05K 7/20818* (2013.01)
(58) Field of Classification Search
CPC ............... H05K 7/20236; H05K 7/203; H05K 7/20327; H05K 7/20318; H05K 7/20818
See application file for complete search history.

(56) References Cited

U.S. PATENT DOCUMENTS

2014/0218861 A1* 8/2014 Shelnutt ............. H05K 7/20818
361/679.53
2023/0091814 A1* 3/2023 Gordon ................ H05K 7/2039
(Continued)

FOREIGN PATENT DOCUMENTS

TW         201508095 A  *  3/2015   ........... C25D 17/008
WO    WO-2019043835 A1 *  3/2019   ............... G06F 1/20
WO    WO-2019058469 A1 *  3/2019   ........... H01L 23/427

OTHER PUBLICATIONS

Tsai Sui-Ho, "Electroplating apparatus for manufacturing flexible printed circuit board", Mar. 1, 2015, Intech Electronics Co Ltd, Entire Document (Translation of TW 201508095). (Year: 2015).*

(Continued)

*Primary Examiner* — Stephen S Sul
(74) *Attorney, Agent, or Firm* — ScienBiziP, P.C.

(57) ABSTRACT

A flow guiding device in an immersion-cooled chassis of a server comprises at least one deflector located above a chip on a mainboard in the chassis, each deflector comprises a first end for mounting to the mainboard above the chip and a second end inclined away from the mainboard. The first end is immersed in coolant, the second end is higher than the first end; the deflector further comprises a hollow part including multiple through holes for interrupting upward movement vapor bubbles generated by the hot chip, which reduces probability of the vapor bubbles escaping from the coolant liquid and the chassis. A liquid-cooled chassis having the flow guiding device is also disclosed.

9 Claims, 8 Drawing Sheets

(56) References Cited

U.S. PATENT DOCUMENTS

| | | | | |
|---|---|---|---|---|
| 2023/0225077 A1* | 7/2023 | Sweeney, II | ....... | H05K 7/20236 |
| | | | | 361/679.47 |
| 2023/0232583 A1* | 7/2023 | Manousakis | ........... | H05K 7/203 |
| | | | | 361/679.47 |
| 2023/0232585 A1* | 7/2023 | Lau | .................... | H05K 7/20327 |
| | | | | 361/700 |
| 2024/0260230 A1* | 8/2024 | Bucci | ........................ | G06F 1/20 |

OTHER PUBLICATIONS

Hachiya Mahiro; Yoshikawa Minoru; Ishihara Kunihiko; Wada Mizuki, "Electronic Device", Mar. 7, 2019, NEC Corp , Entire Document (Translation of WO 2019043835). (Year: 2019).*

Hachiya Mahiro; Ishihara Kunihiko; Wada Mizuki; Yoshikawa Minoru, "Electronic Device", Mar. 28, 2019, NEC Corp , Entire Document (Translation of WO 2019058469). (Year: 2019).*

* cited by examiner

FLOW GUIDING DEVICE AND LIQUID-COOLED CHASSIS WITH SAME

CROSS-REFERENCE TO RELATED APPLICATION

This application claims priority to China Application No. 202222986185.0, having a filing date of Nov. 2, 2022, filed in China State Intellectual Property Administration, the entire contents of which are hereby incorporate by reference.

FIELD

The subject matter relates to heat dissipation devices, and more particularly, to a flow guiding device and a liquid-cooled chassis with the flow guiding device.

BACKGROUND

With development of computing devices such as servers with a great number of chips, heat dissipation is challenging. Traditional air-cooling heat dissipation may be insufficient in an environment of high chip density on the computing devices, even though radiators for air-cooling are getting larger and larger to provide a higher heat dissipation capability. Air, having poor heat transfer properties, presents a limitation to achieve high heat transfer and a low heat flux density.

As a result, some data centers use immersion-cooling to cool down computing devices. Liquid-cooling heat dissipation is more effective, but the coolant liquid being heated can boil and/or escape through evaporation, which leads to a loss of the coolant liquid. Therefore, there is room for improvement within the art.

SUMMARY

An objective of the present disclosure is achieved by providing a flow guiding device for a liquid-cooled chassis, comprising at least one deflector inclinedly mounted to a mainboard in the liquid-cooled chassis, wherein each deflector has a first end for connecting to the mainboard and a second end extending away from the mainboard; wherein the first end is immersed in coolant in the liquid-cooled chassis and is positioned above chips on the mainboard, the second end is at a higher elevation than the first end; each deflector has a hollow part, the hollow part comprises multiple through holes, and at least some of the multiple through holes are immersed in the coolant.

Additionally or alternatively, an angle α between each of the at least one deflector and the mainboard is in a range of 45° to 80°.

Additionally or alternatively, when the flow guiding device comprises multiple deflectors, the multiple deflectors are arranged on the mainboard to be above the chips, and the angle α between each of the multiple deflectors and the mainboard increases as a distance between the first end of the deflector and the chips increases.

Additionally or alternatively, the multiple through holes are defined as multiple slots parallel to the mainboard, each of the multiple slots has a range of widths of 1 mm-2 mm.

Additionally or alternatively, the multiple through holes are defined as multiple circular holes arranged regularly, each of the multiple circular holes has a range of diameters of 1 mm-2 mm.

Additionally or alternatively, the multiple through holes are defined as multiple honeycomb holes arranged regularly, each of the multiple honeycomb holes has a range of diameters of 1 mm-2 mm.

Additionally or alternatively, the multiple through holes are defined as multiple holes of a mesh structure, the mesh structure has a mesh size in a range of 10-mesh to 20-mesh.

Additionally or alternatively, the deflector defines a guiding groove at the second end.

According to a further aspect of the disclosure, a liquid-cooled chassis is provided, the liquid-cooled chassis includes a case and a condenser, the case includes a container and a lid, the container has a top opening and the lid covers the top opening to define a cavity for accommodating coolant, the coolant divides the cavity into one area for holding the coolant in liquid phase and another area for vaporized gas above the liquid area, the condenser is mounted to the container and is located in the vaporized gas area; the liquid-cooled chassis further comprises a flow guiding device as above-mentioned.

Additionally or alternatively, the second end of the deflector is mounted to the case.

BRIEF DESCRIPTION OF THE DRAWINGS

Implementations of the present technology will now be described, by way of example only, with reference to the attached figures.

DETAILED DESCRIPTION

Figure 1:
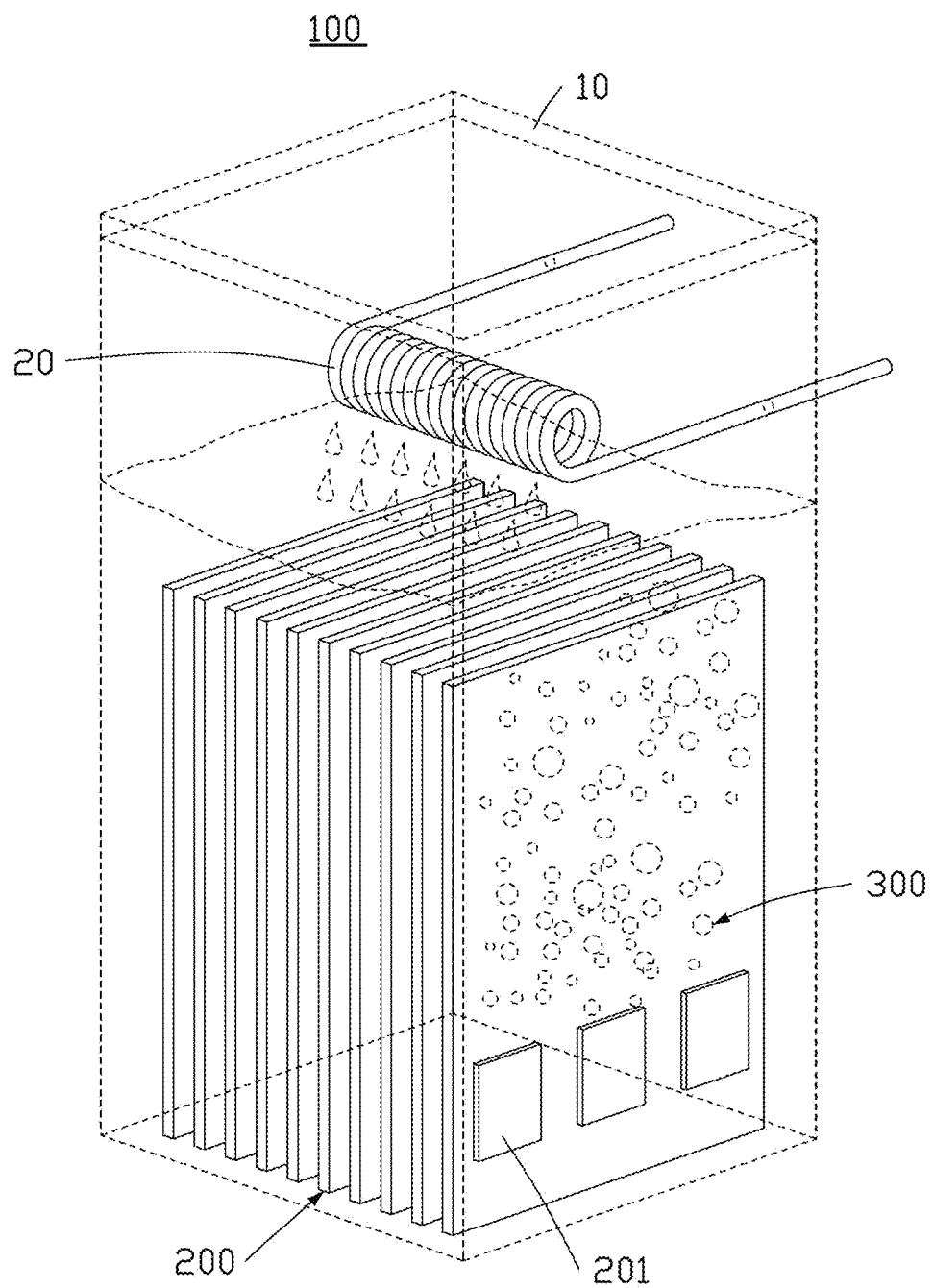
FIG. 1 is a diagrammatic view of a liquid-cooled chassis of a prior art.

It will be appreciated that for simplicity and clarity of illustration, where appropriate, reference numerals have been repeated among the different figures to indicate corresponding or analogous components. The description is not to be considered as limiting the scope of the embodiments described herein. The drawings are not necessarily to scale and the proportions of certain parts may be exaggerated to better illustrate details and features of the present disclosure.

It should be understood that, the terms "first" and "second" are used to distinguish between elements and are not used to denote a particular order or imply a number of technical features, therefore, unless being specifically defined, features described as "first" and "second" may expressly or implicitly include one or more than one of the stated features. In the description of the present application, "plurality" means two or more, unless otherwise expressly and specifically defined.

In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described.

The term "comprising," when utilized, means "including, but not necessarily limited to"; it specifically indicates open-ended inclusion or membership in the so-described combination, group, series, and the like.

Figure 2:
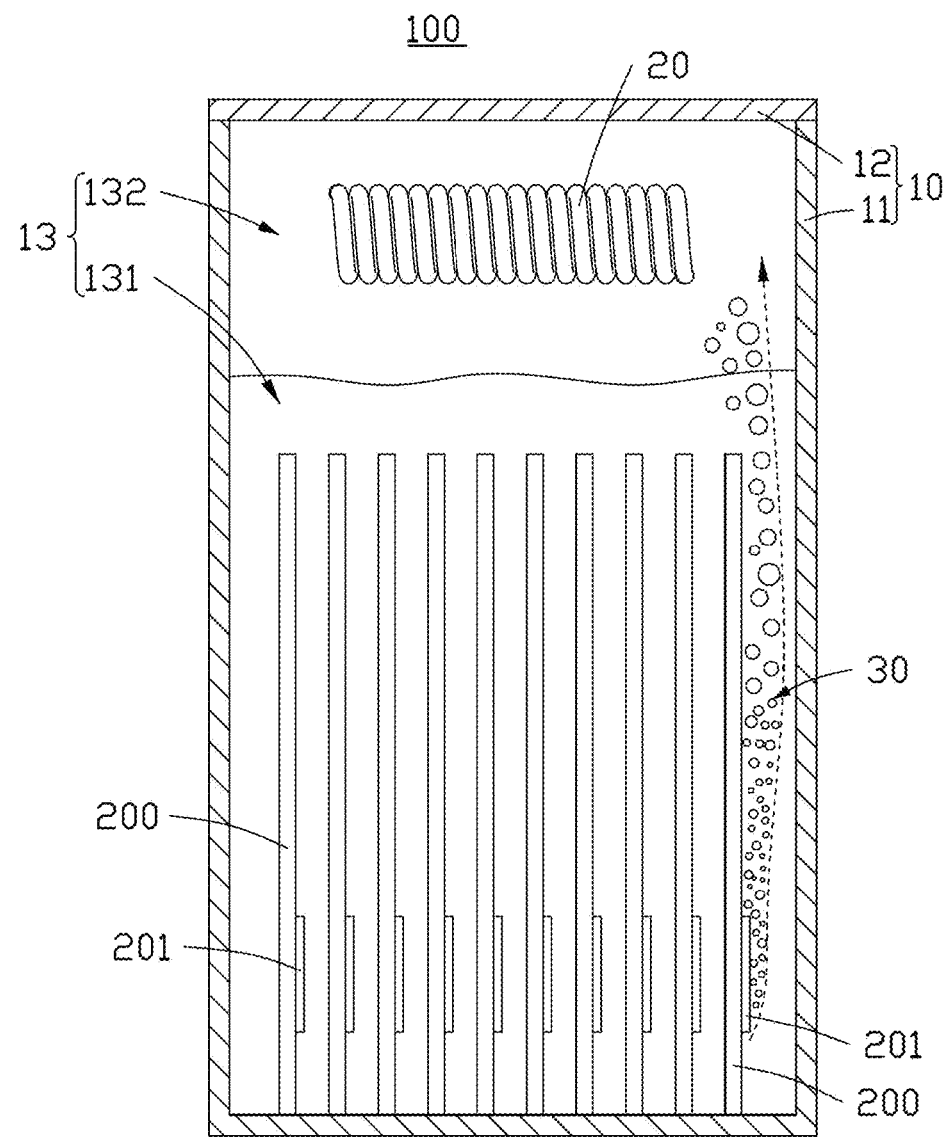
FIG. 2 shows the liquid-cooled chassis of FIG. 1 in use.

FIG. 1 and FIG. 2 illustrate a liquid-cooled chassis 100 of prior art. The liquid-cooled chassis 100 comprises a case 10 and a condenser 20, the case 10 includes a container 11 with a top opening and a lid 12, the lid 12 covers the top opening of the container 11 to define a cavity 13 for accommodating coolant, the cavity 13 is divided into a liquid area 131 that holds the coolant in liquid phase and a gas area 132 above the liquid area 131, the condenser 20 is mounted to the container 11 and is located in the gas area 132, a mainboard 200 and chips thereon are immersed in the coolant. Referring to FIG. 2, when the lid 12 is open and the mainboard 200 is immersed into the coolant, the coolant near the chips 201 of the mainboard 200 is heated to vaporization, which generates vapor bubbles 300 around the chips, the vapor bubbles 300 flow/move rapidly upwards through the liquid area 131 and into the gas area 132, then some condense into liquid on the condenser 20, and others at a high energy level are easily to escape from the container 11, causing loss of the coolant and its vapor. The momentum of the vapor bubbles 300 flowing upward along a hot surface of the chips 201 is theoretically proportional to their velocity squared $V^2$, therefore, by controlling the momentum of vapor bubbles 300 flowing upward/rising speed of vapor bubbles 300, the rising heights of the vapor bubbles 300 can be controlled, and thus coolant leakage can be effectively controlled and reduced.

Figure 3:
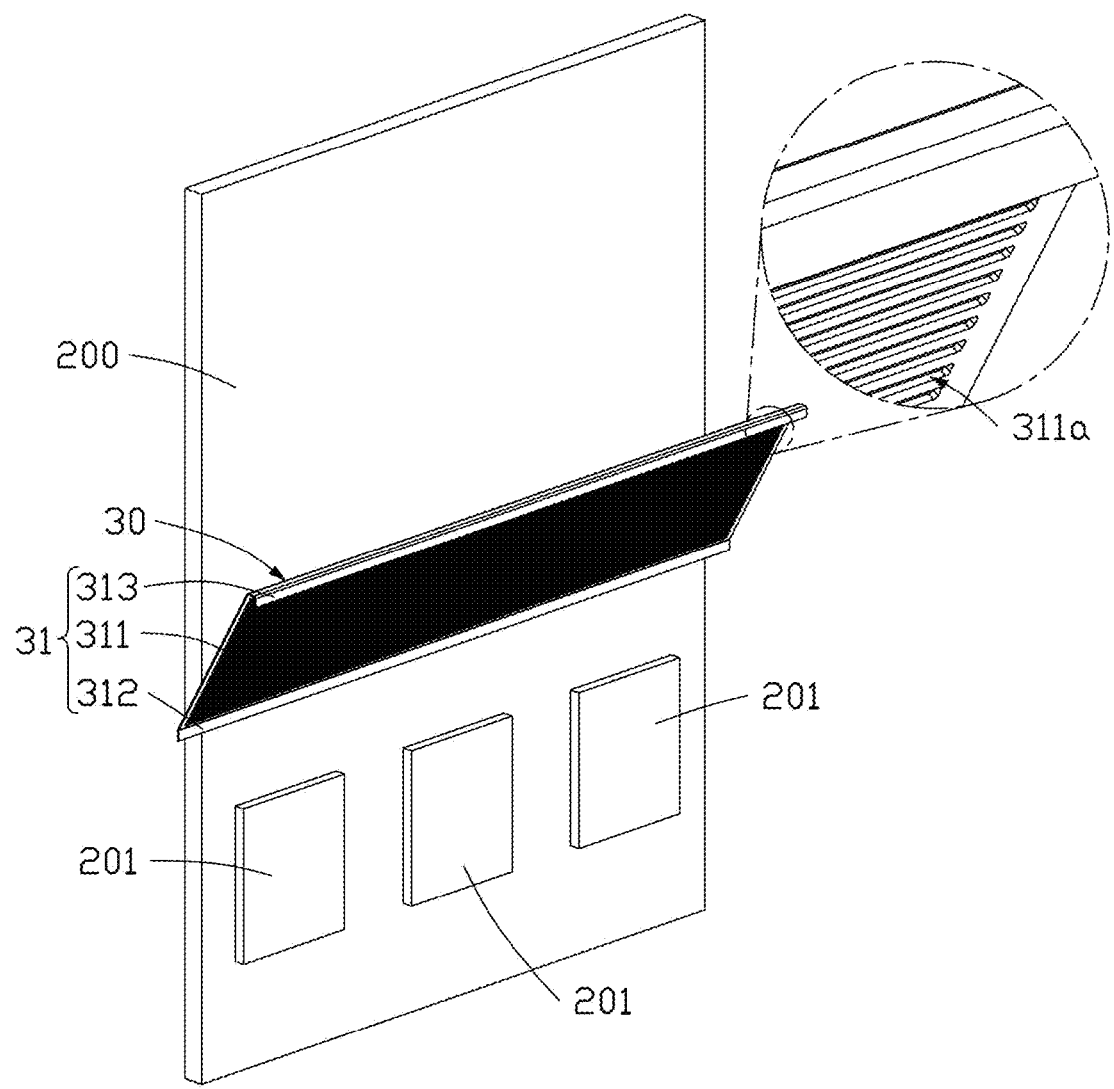
FIG. 3 is a diagrammatic view of a flow guiding device of an embodiment according to the present disclosure.

FIG. 3 shows a flow guiding device 30 according to an embodiment used in a liquid-cooled chassis, the flow guiding device 30 includes a deflector 31 mounted to the mainboard 200. The deflector 31 has a hollow part 311 comprising multiple through holes 311a, the through holes 311a are configured for free passage of the coolant and the vapor bubbles 300. Specifically, the deflector 31 has a first end 312 for connecting to the mainboard 200 above the chips 201 on the mainboard 200 and a second end 313 extends away from the mainboard 200. The second end 313 is higher than the first end 312. Further, the first end 312 and at least part of the hollow part 311 are immersed in the coolant and located above chips 201 on the mainboard 200.

Figure 4:
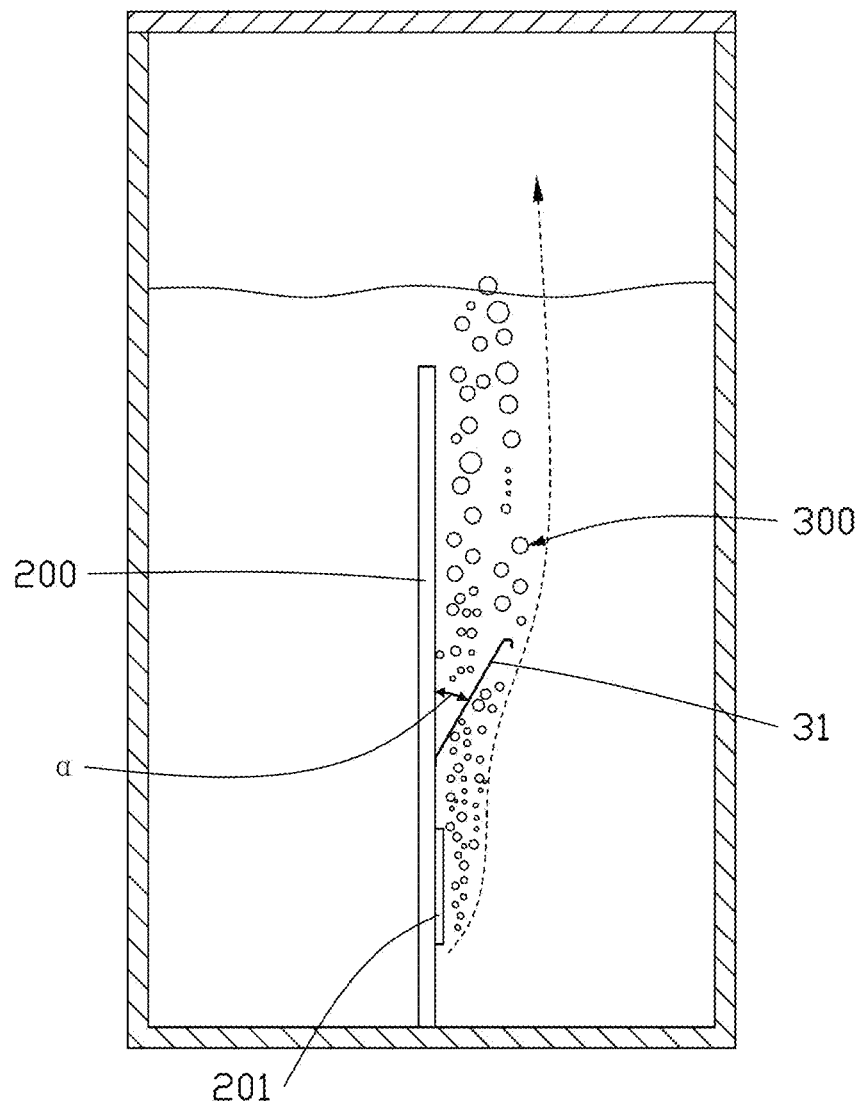
FIG. 4 shows the flow guiding device of FIG. 3 in a use state.

Referring to FIG. 4, in operation, the mainboard 200 is immersed into the coolant, the coolant near the chips 201 of the mainboard 200 is heated and vaporized, generating vapor bubbles 300 around the chips, the vapor bubbles 300 are of different sizes and they flow/move rapidly upwards through the coolant. The deflector 31 is arranged in a path of rising of the vapor bubbles 300, therefore the vapor bubbles 300 are obstructed and held and are diverted to the second end 313 of the deflector 31. During the movement, vapor bubbles 300 of small sizes can pass through the deflector 31 via the through holes 311a, the deflector 31 blocking these vapor bubbles 300 to an extent, then these vapor bubbles 300 continues to rise at a slower speed. The larger-size vapor bubbles 300 cannot pass through the deflector 31, some of them break into vapor bubbles 300 of smaller size by collision with the deflector 31, such reduced-size vapor bubbles 300 can flow through the deflector 31 via the through holes 311a and continue rising up at a slower speed, and other unbroken vapor bubbles 300 flow along the defector 31 towards the second end 313 and flow around the second end 313 to rise up at a slower speed. Therefore, the vapor bubbles 300 gathered in a swift upward flow are broken up, lose some heat, and spread out in an incompact flow moving more slowly, which reduces probability of escape of the vapor bubbles 300 from the coolant and the case 10.

According to a further embodiment, as shown in FIG. 3, the multiple through holes 311a are implemented as multiple slots parallel to the mainboard 200, each slot has a width of 1 mm-2 mm, which width is close to and slightly smaller than most vapor bubbles 300. On one hand, the slots are so narrow that most vapor bubbles 300 are blocked from moving through the deflector 31, on the other hand, the slots are wide enough to allow the coolant in liquid phase to flow through.

Figure 5A:
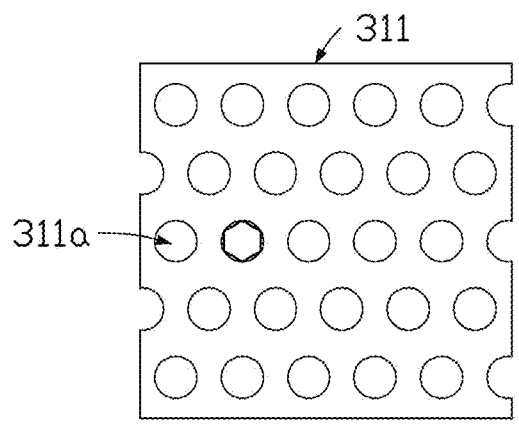
FIGS. 5A, 5B and 5C show different embodiments of a hollow portion of the flow guiding device.

According to a further embodiment, referring to FIG. 5A, the multiple through holes 311a are implemented as multiple circular holes arranged regularly, each circular hole having a diameter in range of 1 mm-2 mm.

Figure 5B:
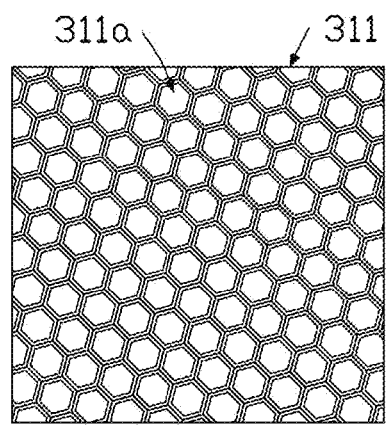

According to a further embodiment, referring to FIG. 5B, the multiple through holes 311a are implemented as multiple honeycomb holes arranged regularly, each honeycomb hole having a diameter in range of 1 mm-2 mm.

Figure 5C:
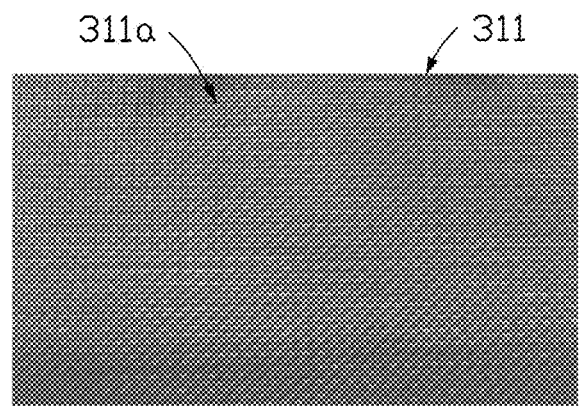

According to a further embodiment, referring to FIG. 5C, the multiple through holes 311a are implemented as multiple holes of a mesh structure, the mesh structure has an individual mesh size in a range of 10-mesh to 20-mesh. Preferably, the mesh size is 12-mesh.

Therefore, in manufacturing, the structure of the hollow part 311 can be adjusted according to actual requirements, such as type of coolant used, the size of the vapor bubbles generated, etc., so as to break up rapidly rising large vapor bubbles 300, interrupt the rapidly rising trend of the large vapor bubbles 300, and reduce the loss of coolant.

According to a further embodiment, as shown in FIG. 4, an angle α between the deflector 31 and the mainboard 200 is in a range of 45° to 80°. Therefore, the deflector 31 is inclined to the mainboard 200 to lead the vapor bubbles 300 away and outward from the mainboard 200, which helps to spread out the flow of the vapor bubbles 300, slow down their speed, and reduce the loss of coolant.

Figure 6:
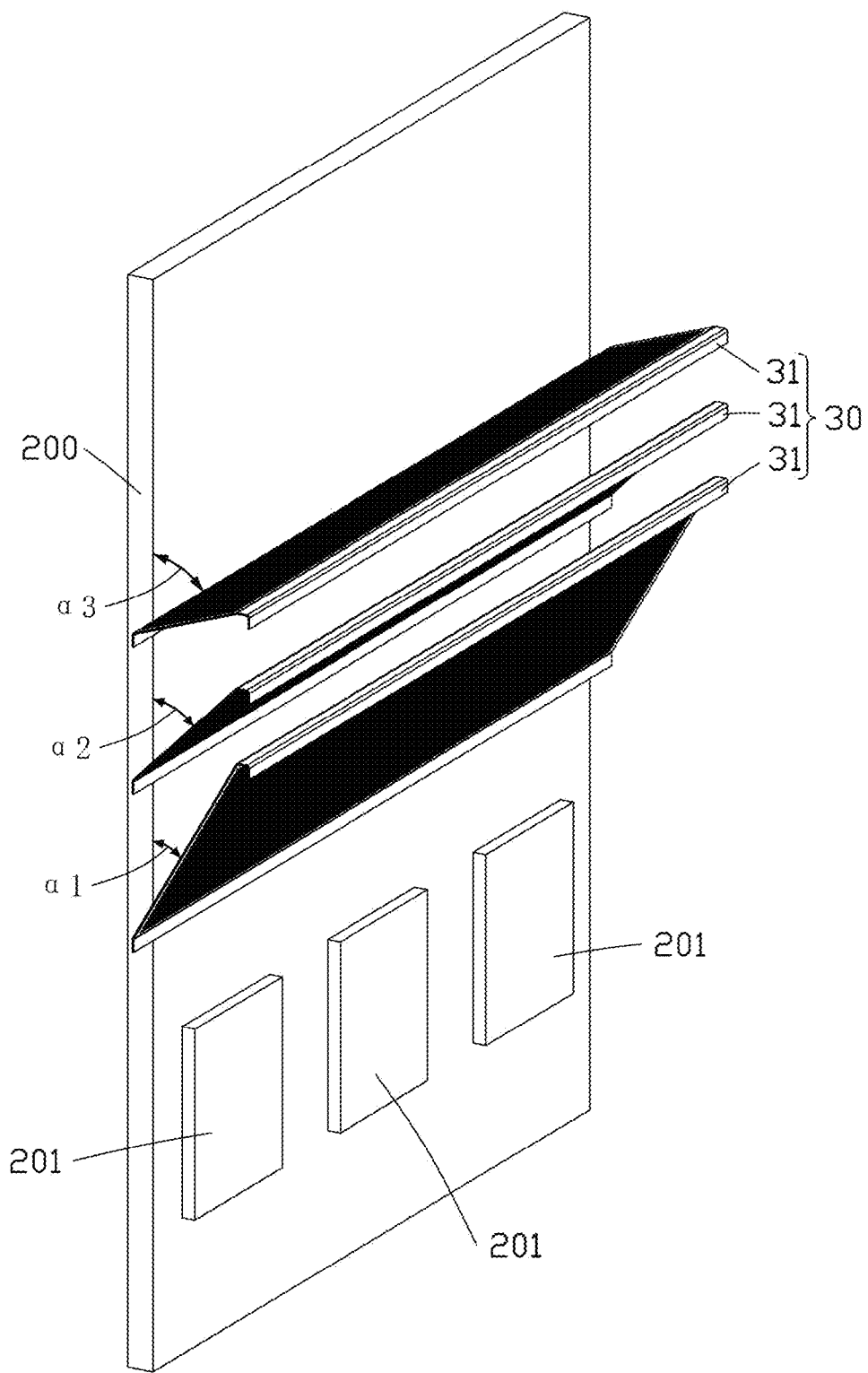
FIG. 6 is a diagrammatic view of a flow guiding device of another embodiment according to the present disclosure.
Figure 7:
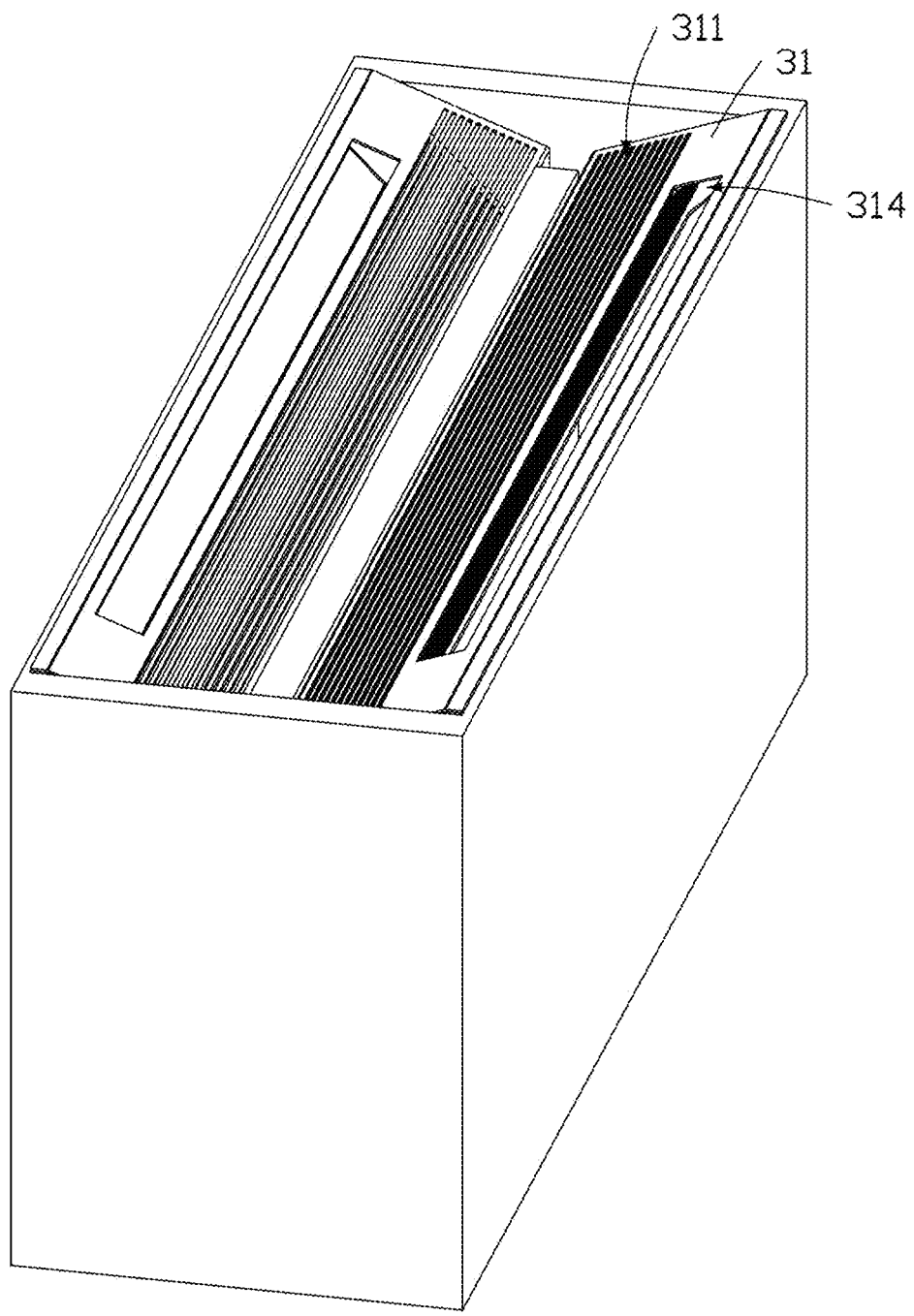
FIG. 7 is a diagrammatic view of a flow guiding device of yet another embodiment according to the present disclosure.

According to a further embodiment, as shown in FIG. 6, the flow guiding device 30 includes multiple deflectors 31, the multiple deflectors 31 are arranged on the mainboard 200 vertically above the chips 201, the angle α between each of the multiple deflectors 31 and the mainboard 200 increases as the distance between the first end 312 of the deflector 31 and the chips 201 increases. As illustrated in FIG. 6, in this embodiment, the flow guiding device includes three deflectors 31 arranged vertically on the mainboard 200, the angle between the three deflectors 31 and the mainboard 200 is respectively $\alpha_1$, $\alpha_2$, and $\alpha_3$, wherein $\alpha_1 < \alpha_2 < \alpha_3$.

Therefore, the vapor bubbles 300 need to pass through these three deflectors 31 in the rising path, then, on passing one deflector 31, the flow of the vapor bubbles 300 is spread a little wider and the speed of the flow of the vapor bubbles 300 is slowed down a little; further, with the angle α increasing, the flow of the vapor bubbles 300 is deflected further from the mainboard 200 than when moving past the previous deflector 31, and the flow of the vapor bubbles 300 is spread out wider. Therefore, the flow of the vapor bubbles 300 is spread out wider step by step, which slows down the speed of the vapor bubbles 300 and reduces the loss of coolant.

According to a further embodiment, the deflector 31 defines a guiding groove 314 at the second end 313, the guiding groove 314 has a size larger than each through hole 311a of the hollow part 311, the guiding groove 314 is configured for circulation of gas/air/coolant for improving efficiency of cooling.

Figure 8:
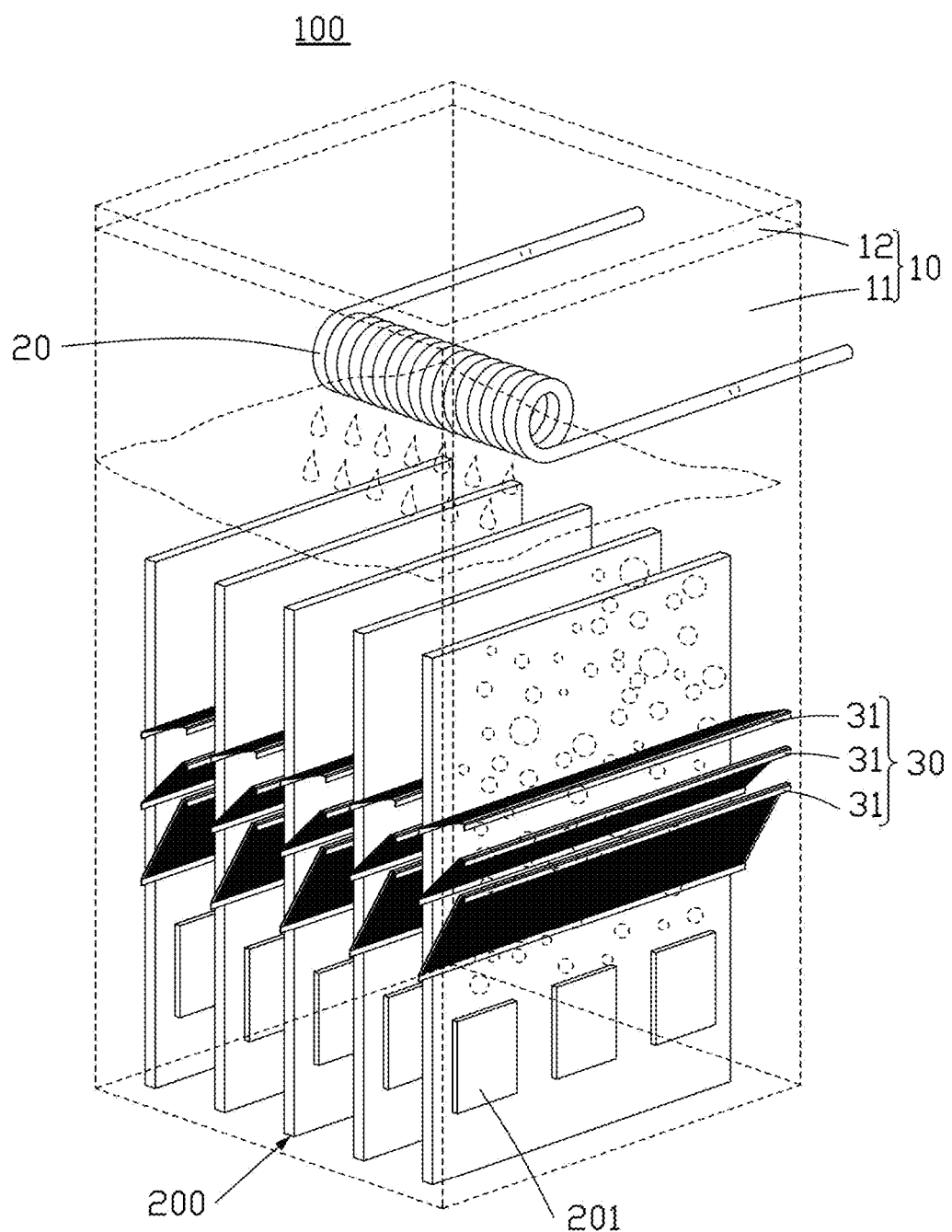
FIG. 8 is a diagrammatic view of a liquid-cooled chassis of another embodiment according to the present disclosure.

According to a further embodiment, as shown in FIG. 8, a liquid-cooled chassis 100 is provided, the liquid-cooled chassis 100 includes a case 10, a condenser 20, and a flow guiding device 30 as above-mentioned. The case 10 includes a container 11 with a top opening 111 and a lid 12, the lid 12 covers the top opening 111 of the container 11 to define a cavity 13 for accommodating coolant, the cavity 13 is divided into a liquid area 131 that holds the coolant in liquid phase and a gas area 132 above the liquid area 131, the condenser 20 is mounted to the container 11 and located in the gas area 132, a mainboard 200 is placed vertically upright in the coolant for cooling down, the flow guiding device 30 includes multiple deflectors 31 arranged above chips 201 on the mainboard 200. In this embodiment, the chips 201 on the mainboard 200 are heat-generating, and the coolant near the chips 201 is heated and vaporized, generating vapor bubbles 300 around the chips, the vapor bubbles 300 flowing rapidly upwards are blocked and spread out by the multiple deflectors 31 to form a dispersed and incompact vapor bubble flow which moves more slowly, which reduces probability of the vapor bubbles 300 escaping from the coolant and the case 10.

According to a further embodiment, the second end 313 of the deflector 31 is mounted to the case 11, which provides a stable structure for the flow guiding device 30.

While the invention has been described in detail in connection with only a limited number of embodiments, it should be readily understood for the skilled in the art that the invention is not limited to such disclosed embodiments. Rather, the invention can be modified to incorporate any number of variations, alterations, substitutions, or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. A flow guiding device configured for a liquid-cooled chassis, the flow guiding device comprising at least one deflector inclinedly mounted to a mainboard in the liquid-cooled chassis, wherein each of the at least one deflector comprises a first end configured for connecting to the mainboard and a second end extending away from the mainboard; wherein
the first end is configured to be immersed in coolant in the liquid-cooled chassis and is positioned above chips on the mainboard, the second end is at a higher elevation than the first end;
each of the at least one deflector comprises a hollow part, the hollow part comprises multiple through holes, and at least some of the multiple through holes are immersed in the coolant;
wherein the at least one deflector comprises multiple deflectors, the multiple deflectors are arranged on the mainboard to be above the chips, an angle α between each of the multiple deflectors and the mainboard increases as a distance between the first end of the respective deflector and the chips increases.

2. The flow guiding device of claim 1, wherein the angle α between each of the multiple deflectors and the mainboard is in a range of 45° to 80°.

3. The flow guiding device of claim 1, wherein the multiple through holes are multiple slots, the multiple slots extend parallel to the mainboard, and a width of each of the multiple slots is in a range of 1 mm to 2 mm.

4. The flow guiding device of claim 1, wherein the multiple through holes are multiple circular holes, the multiple circular holes are uniformly arranged, a diameter of each of the multiple circular holes is in a range of 1 mm to 2 mm.

5. The flow guiding device of claim 1, wherein the multiple through holes are multiple honeycomb holes, the multiple honeycomb holes are uniformly arranged, a diameter of each of the multiple honeycomb holes is in a range of 1 mm to 2 mm.

6. The flow guiding device of claim 1, wherein the multiple through holes are multiple holes of a mesh structure, a size of the mesh structure is in a range of 10-mesh to 20-mesh.

7. The flow guiding device of claim 1, wherein the deflector further comprises a guiding groove at the second end.

8. The flow guiding device of claim 1, wherein the liquid-cooled chassis comprises:
a case comprising a container, the container comprising a top opening and a lid, wherein α cavity is formed when the lid covers the top opening of the container, the cavity is configured for accommodating the coolant in a liquid form and in a vapor form, a liquid level of the coolant in the liquid form divides the cavity into one area for holding the coolant in liquid form and another area for the coolant in the vapor form above the liquid area;
a condenser mounted to the container and located in the area for the coolant in the vapor form of the cavity; and
the flow guiding device of claim 1.

9. The flow guiding device of claim 8, wherein the second end of each of the multiple deflectors is mounted to the case.

\* \* \* \* \*